United States Patent
Zhou et al.

(10) Patent No.: US 9,444,410 B1
(45) Date of Patent: Sep. 13, 2016

(54) WIDE-BAND SINGLE-ENDED-TO-DIFFERENTIAL LOW-NOISE AMPLIFIER USING COMPLEMENTARY PUSH-PULL STRUCTURE

(71) Applicant: AltoBeam Inc., Beijing (CN)

(72) Inventors: Renjie Zhou, Beijing (CN); Xiang Guan, Beijing (CN)

(73) Assignee: AltoBeam Inc., Beijing (CN)

( * ) Notice: Subject to any disclaimer, the term of this patent is extended or adjusted under 35 U.S.C. 154(b) by 0 days.

(21) Appl. No.: 14/715,837

(22) Filed: May 19, 2015

(51) Int. Cl.
H03F 3/45 (2006.01)
H03F 1/26 (2006.01)
H03F 3/16 (2006.01)
H03G 1/00 (2006.01)

(52) U.S. Cl.
CPC .......... *H03F 1/26* (2013.01); *H03F 3/16* (2013.01); *H03G 1/0029* (2013.01); *H03F 2200/18* (2013.01); *H03F 2200/294* (2013.01)

(58) Field of Classification Search
CPC ........ H03F 3/26; H03F 3/45; H03F 2200/06; H03F 2200/09
USPC .................. 330/255, 264, 269, 301
See application file for complete search history.

(56) References Cited

U.S. PATENT DOCUMENTS

| | | | |
|---|---|---|---|
| 5,963,065 A | 10/1999 | Alini et al. | |
| 7,098,739 B2 | 8/2006 | Chow et al. | |
| 7,164,318 B2 | 1/2007 | Costa et al. | |
| 7,184,799 B1 | 2/2007 | Jin et al. | |
| 7,215,201 B2 * | 5/2007 | Roine | H03F 3/45264 330/255 |
| 7,949,322 B2 | 5/2011 | Kim et al. | |
| 8,242,844 B2 | 8/2012 | Rafi | |
| 8,482,676 B2 | 7/2013 | Hung | |
| 8,698,560 B2 | 4/2014 | Li et al. | |
| 8,754,710 B2 | 6/2014 | Li et al. | |
| 2009/0027128 A1 | 1/2009 | Ishiguro | |

OTHER PUBLICATIONS

Bruccoleri et al., "Wide-Band CMOS Low-Noise Amplifier Exploiting Thermal Noise Canceling," IEEE Journal of Solid-State Circuits, vol. 39, No. 2, Feb. 2004, pp. 275-282.
Zhuo et al., "Using Capacitive Cross-Coupling Technique in RF Low Noise Amplifiers and Down-Conversion Mixer Design," IEEE Proceedings of the 26th European Solid-State Circuits Conference (held in Stockholm, Sweden), Sep. 19-21, 2000, pp. 77-80.
Zhuo et al., "A Capacitor Cross-Coupled Common-Gate Low-Noise Amplifier," IEEE Transactions on Circuits and Systems—II: Express Briefs, vol. 52, No. 12, Dec. 2005, pp. 875-879.

* cited by examiner

*Primary Examiner* — Steven J Mottola
(74) *Attorney, Agent, or Firm* — Jacobsen IP Law; Krista S. Jacobsen

(57) ABSTRACT

A wide-band single-ended-to-differential low-noise amplifier using a push-pull architecture with an input node coupled to the sources of a first PMOS transistor and a first NMOS transistor, a positive output node coupled to the drains of the first PMOS transistor and the first NMOS transistor, a negative output node coupled to the drains of a second PMOS transistor and a second NMOS transistor, and bias circuitry coupled to the gates of the first and second PMOS and first and second NMOS transistors. The source of the first PMOS transistor is coupled to the gate of the second PMOS transistor, the source of the first NMOS transistor is coupled to the gate of the second NMOS transistor, the source of the second PMOS transistor is coupled to a first supply voltage, and the source of the second NMOS transistor is coupled to a second supply voltage.

20 Claims, 3 Drawing Sheets

WIDE-BAND SINGLE-ENDED-TO-DIFFERENTIAL LOW-NOISE AMPLIFIER USING COMPLEMENTARY PUSH-PULL STRUCTURE

BACKGROUND

Commercial television receivers and set-top boxes that support various digital television standards receive audio and video programming via a wide-band radio-frequency (RF) signal comprising multiple channels. The wide-band RF signal can be received over-the-air (e.g., from a terrestrial broadcast), through a cable (e.g., a coaxial cable), or from a satellite.

These wide-band signals include channels that are distributed over a wide spectrum. For example, the channels may be distributed in the spectrum between 42 MHz and 1002 MHz. A tuner within the receiver selects a single channel from the available channels. The tuner is agile so that a user can select different channels. The objective is to filter out the energy from the undesired channels, leaving only the energy from the desired channel.

The power of the received wide-band signal may be low or high. When the power is low, the receiver should be able to boost the signal significantly without adding substantial noise. When the power is high, the receiver should not saturate.

To boost the power of the received signal, the receiver may include a wide-band low-noise amplifier (LNA) that amplifies the received wide-band signal before the tuner selects one of the channels. The LNA boosts the inbound signal level prior to the frequency conversion process, which prevents mixer noise from dominating the overall receiver front-end performance. Because the received signal may be weak, it is desirable for the LNA to have a low noise figure so that the effect on the input signal of any noise generated by the LNA is low.

Unwanted signals can couple into the desired channel because of harmonic, inter-modulation, and other nonlinear effects. For example, because of the wide-band nature of the received frequency band, there can be an interfering channel with a frequency that is half or a third of the desired channel's frequency. Through second-order or third-order distortion, this interfering channel can cause interference to the desired channel, thereby corrupting the picture quality. Furthermore, a single large interferer can saturate the LNA. Nonlinearities in the LNA may also cause interferers to generate inter-modulation components in the desired channel. These inter-modulation components add noise to the desired channel, thus decreasing the sensitivity of the receiver.

Therefore, it is desirable for the LNA to provide, over a wide range of frequencies, a sufficiently large gain, adequate linearity, a low noise figure, and source impedance matching, while allowing some variable gain to enable the LNA to handle interference.

A balanced common-gate wide-band LNA was described by W. Zhuo et al. in the paper entitled "Using Capacitive Cross-Coupling Technique in RF Low Noise Amplifiers and Down-Conversion Mixer Design," published in Proceedings of the 26th European Solid-State Circuits Conference, held in Stockholm, Sweden from Sep. 19-21, 2000, which is hereby incorporated by reference for all purposes. An LNA in accordance with the disclosures of Zhuo is illustrated in FIG. 1. As shown in FIG. 1, the single-ended input signal is converted to differential signals by a passive off-chip balun. The differential signals flow into the sources of the common-gate-connected transistors labeled M1A and M2A. They then flow out of the drains of the two transistors. The source of transistor M1A is AC-coupled to the gate of transistor M2A by capacitor C21, and the source of transistor M2A is AC-coupled to the gate of transistor M1A by capacitor C11.

The symmetrical structure of the LNA of FIG. 1 reduces second-order nonlinearities. The use of the capacitor cross-coupling technique also benefits gain boosting and noise cancelling. Therefore, the noise figure of the LNA of FIG. 1 is better than the noise figure of a basic common-gate LNA. But the LNA of FIG. 1 has two apparent drawbacks. First, the off-chip passive balun introduces a loss and increases the cost of the LNA. Second, to meet input impedance matching requirements, the transconductances of transistor M1A and M2A are relatively high, resulting high power consumption.

Another wide-band LNA with thermal noise canceling was described by Bruccoleri et al. in the paper "Wide-band CMOS Low-Noise Amplifier Exploiting Thermal Noise Canceling," published in the February 2004 issue of the IEEE Journal of Solid-State Circuits, volume 39, no. 2, pp. 275-282, which is hereby incorporated by reference for all purposes. An LNA in accordance with the disclosures of Bruccoleri, referred to herein as the common-source common-gate (CG-CS) LNA, is illustrated in FIG. 2. To accomplish single-ended-to-differential conversion, the CG-CS LNA positively amplifies the single-ended input signal by the common-gate-connected transistor M1B and negatively amplifies the single-ended input signal by common-source transistor M2B. The CG-CS LNA can completely cancel transistor M1B's channel noise current under the conditions of input impedance matching and balanced output. Thus, the noise figure of the CG-CS LNA is relatively low. The nonlinear production of transistor M1B can also be cancelled by the same mechanism, but the second-order and third-order nonlinear effects of the common source connected transistor M2B limit the dynamic range of the CG-CS LNA.

SUMMARY

Disclosed herein are embodiments of a novel push-pull complementary single-ended-to-differential wide-band LNA that addresses drawbacks of the prior art. In some embodiments, an input node is coupled to the sources of a first PMOS transistor and a first NMOS transistor, a positive output node is coupled to the drains of the first PMOS transistor and the first NMOS transistor, a negative output node is coupled to the drains of a second PMOS transistor and a second NMOS transistor, and bias circuitry is coupled to the gates of the first and second PMOS and first and second NMOS transistors. The source of the first PMOS transistor is coupled to the gate of the second PMOS transistor, the source of the first NMOS transistor is coupled to the gate of the second NMOS transistor, the source of the second PMOS transistor is coupled to a first supply voltage, and the source of the second NMOS transistor is coupled to a second supply voltage. In some embodiments, the second supply voltage is ground.

In some embodiments, the LNA includes a first capacitor disposed between the input node and the source of the first PMOS transistor, and a second capacitor disposed between the input node and the source of the first NMOS transistor.

In some embodiments, the LNA includes a first capacitor disposed between the source of the first PMOS transistor and the gate of the second PMOS transistor, and a second capacitor disposed between the source of the first NMOS transistor and the gate of the second NMOS transistor.

In some embodiments, the LNA includes a first inductor disposed between the first supply voltage and a first node coupling the source of the first PMOS transistor to the gate of the second PMOS transistor, and a second inductor disposed between the second supply voltage and a second node coupling the source of the first NMOS transistor to the gate of the second NMOS transistor.

In some embodiments, the LNA includes a first capacitor disposed between the input node and the source of the first PMOS transistor, a second capacitor disposed between the input node and the source of the first NMOS transistor, a third capacitor disposed between the source of the first PMOS transistor and the gate of the second PMOS transistor, a fourth capacitor disposed between the source of the first NMOS transistor and the gate of the second NMOS transistor, a first inductor disposed between the first supply voltage and a first node coupling the source of the first PMOS transistor to the gate of the second PMOS transistor, and a second inductor disposed between the second supply voltage and a second node coupling the source of the first NMOS transistor to the gate of the second NMOS transistor.

In some embodiments, the LNA includes a load circuit disposed between the positive output node and the negative output node, the load circuit comprising a third PMOS transistor, a fourth PMOS transistor, a third NMOS transistor, and a fourth NMOS transistor, wherein a source of the third PMOS transistor and a source of the fourth PMOS transistor are coupled to the first supply voltage, a source of the third NMOS transistor and a source of the fourth NMOS transistor are coupled to the second supply voltage, a gate and a drain of the third PMOS transistor and a gate and a drain of the third NMOS transistor are coupled to the positive output node, and a gate and a drain of the fourth PMOS transistor and a gate and a drain of the fourth NMOS transistor are coupled to the negative output node.

In some embodiments, the LNA includes gain control circuitry comprising a third PMOS transistor, a fourth PMOS transistor, a fifth PMOS transistor, a sixth PMOS transistor, a third NMOS transistor, a fourth NMOS transistor, a fifth NMOS transistor, and a sixth NMOS transistor, wherein a source of the third PMOS transistor and a source of the fourth PMOS transistor are coupled to the drain of the first PMOS transistor, a source of the fifth PMOS transistor and a source of the sixth PMOS transistor are coupled to the drain of the second PMOS transistor, a source of the third NMOS transistor and a source of the fourth NMOS transistor are coupled to the drain of the first NMOS transistor, a source of the fifth NMOS transistor and a source of the sixth NMOS transistor are coupled to the drain of the second NMOS transistor, a drain of the fourth PMOS transistor and a drain of the fourth NMOS transistor are coupled to the positive output node, a drain of the fifth PMOS transistor and a drain of the fifth NMOS transistor are coupled to the negative output node, a gate of the third PMOS transistor, a gate of the fourth PMOS transistor, a gate of the fifth PMOS transistor, and a gate of the sixth PMOS transistor are coupled to the bias circuitry, and a gate of the third NMOS transistor, a gate of the fourth NMOS transistor, a gate of the fifth NMOS transistor, and a gate of the sixth NMOS transistor are coupled to the bias circuitry.

In some embodiments, the LNA comprises an integrated circuit with a positive output node coupled to a drain of a first PMOS transistor and to a drain of a first NMOS transistor, a negative output node coupled to a drain of a second PMOS transistor and to a drain of a second NMOS transistor, a first node coupling a source of the first NMOS transistor to a gate of the second NMOS transistor, and a second node coupling a source of the first PMOS transistor to a gate of the second PMOS transistor, and bias circuitry coupled to the first and second nodes, and to gates of the first PMOS and NMOS transistors. In some embodiments, the integrated circuit further comprises an input node coupled to the first node and to the second node.

In some embodiments, the integrated circuit includes a first capacitor disposed between the first node and the gate of the second NMOS transistor, and a second capacitor disposed between the second node and the gate of the second PMOS transistor.

In some embodiments, the LNA having an integrated circuit includes components not incorporated into the integrated circuit, such as a first capacitor disposed between the input node and the first node, a second capacitor disposed between the input node and the second node, a first inductor disposed between a first supply voltage and the first node, and/or a second inductor disposed between a second supply voltage and the second node. In some embodiments, the first supply voltage is ground.

In some embodiments, the integrated circuit includes a load circuit disposed between the positive output node and the negative output node, the load circuit comprising a third PMOS transistor, a fourth PMOS transistor, a third NMOS transistor, and a fourth NMOS transistor, wherein a source of the third PMOS transistor and a source of the fourth PMOS transistor are coupled to the second supply voltage, a source of the third NMOS transistor and a source of the fourth NMOS transistor are coupled to the first supply voltage, a gate and a drain of the third PMOS transistor and a gate and a drain of the third NMOS transistor are coupled to the positive output node, and a gate and a drain of the fourth PMOS transistor and a gate and a drain of the fourth NMOS transistor are coupled to the negative output node.

In some embodiments, the integrated circuit includes gain control circuitry comprising a third PMOS transistor, a fourth PMOS transistor, a fifth PMOS transistor, a sixth PMOS transistor, a third NMOS transistor, a fourth NMOS transistor, a fifth NMOS transistor, and a sixth NMOS transistor, wherein a source of the third PMOS transistor and a source of the fourth PMOS transistor are coupled to the drain of the first PMOS transistor, a source of the fifth PMOS transistor and a source of the sixth PMOS transistor are coupled to the drain of the second PMOS transistor, a source of the third NMOS transistor and a source of the fourth NMOS transistor are coupled to the drain of the first NMOS transistor, a source of the fifth NMOS transistor and a source of the sixth NMOS transistor are coupled to the drain of the second NMOS transistor, a drain of the fourth PMOS transistor is coupled to a drain of the fourth NMOS transistor, a drain of the fifth PMOS transistor is coupled to a drain of the fifth NMOS transistor, a gate of the third PMOS transistor, a gate of the fourth PMOS transistor, a gate of the fifth PMOS transistor, and a gate of the sixth PMOS transistor are coupled to the bias circuitry, and a gate of the third NMOS transistor, a gate of the fourth NMOS transistor, a gate of the fifth NMOS transistor, and a gate of the sixth NMOS transistor are coupled to the bias circuitry.

In some embodiments, an integrated circuit for use in a LNA comprises a first PMOS transistor, a second PMOS transistor, a first NMOS transistor, a second NMOS transistor, and a bias circuit. In some such embodiments, a drain of the first PMOS transistor and a drain of the first NMOS transistor are coupled to a first output node, a drain of the second PMOS transistor and a drain of the second NMOS transistor are coupled to a second output node, a source of the first PMOS transistor is coupled to a gate of the second PMOS transistor, a source of the first NMOS transistor is coupled to a gate of the second NMOS transistor, and the source of the first PMOS transistor, the gate of the first PMOS transistor, the gate of the second PMOS transistor, the source of the first NMOS transistor, the gate of the first NMOS transistor, and the gate of the second NMOS transistor are coupled to the bias circuit.

In some embodiments of an integrated circuit for use in a LNA, the first output node is a positive output node, and the second output node is a negative output node.

In some embodiments, the integrated circuit for use in a LNA includes a load circuit disposed between the first output node and the second output node, the load circuit comprising a third PMOS transistor, a fourth PMOS transistor, a third NMOS transistor, and a fourth NMOS transistor, wherein a source of the third PMOS transistor and a source of the fourth PMOS transistor are coupled to a first supply voltage, a source of the third NMOS transistor and a source of the fourth NMOS transistor are coupled to a second supply voltage, a gate and a drain of the third PMOS transistor and a gate and a drain of the third NMOS transistor are coupled to the first output node, and a gate and a drain of the fourth PMOS transistor and a gate and a drain of the fourth NMOS transistor are coupled to the second output node.

In some embodiments, the integrated circuit for use in a LNA includes gain control circuitry comprising a third PMOS transistor, a fourth PMOS transistor, a fifth PMOS transistor, a sixth PMOS transistor, a third NMOS transistor, a fourth NMOS transistor, a fifth NMOS transistor, and a sixth NMOS transistor, wherein a source of the third PMOS transistor and a source of the fourth PMOS transistor are coupled to the drain of the first PMOS transistor, a source of the fifth PMOS transistor and a source of the sixth PMOS transistor are coupled to the drain of the second PMOS transistor, a source of the third NMOS transistor and a source of the fourth NMOS transistor are coupled to the drain of the first NMOS transistor, a source of the fifth NMOS transistor and a source of the sixth NMOS transistor are coupled to the drain of the second NMOS transistor, a drain of the fourth PMOS transistor is coupled to a drain of the fourth NMOS transistor, a drain of the fifth PMOS transistor is coupled to a drain of the fifth NMOS transistor, a gate of the third PMOS transistor, a gate of the fourth PMOS transistor, a gate of the fifth PMOS transistor, and a gate of the sixth PMOS transistor are coupled to the bias circuit, and a gate of the third NMOS transistor, a gate of the fourth NMOS transistor, a gate of the fifth NMOS transistor, and a gate of the sixth NMOS transistor are coupled to the bias circuit.

BRIEF DESCRIPTION OF THE DRAWINGS

Objects, features, and advantages of the disclosure will be readily apparent from the following description of certain embodiments taken in conjunction with the accompanying drawings in which.

DETAILED DESCRIPTION

Disclosed herein are embodiments of a novel push-pull complementary single-ended-to-differential wide-band LNA that addresses drawbacks of approaches disclosed in the prior art, including those disclosed by Zhuo and Bruccoleri.

Figure 3:
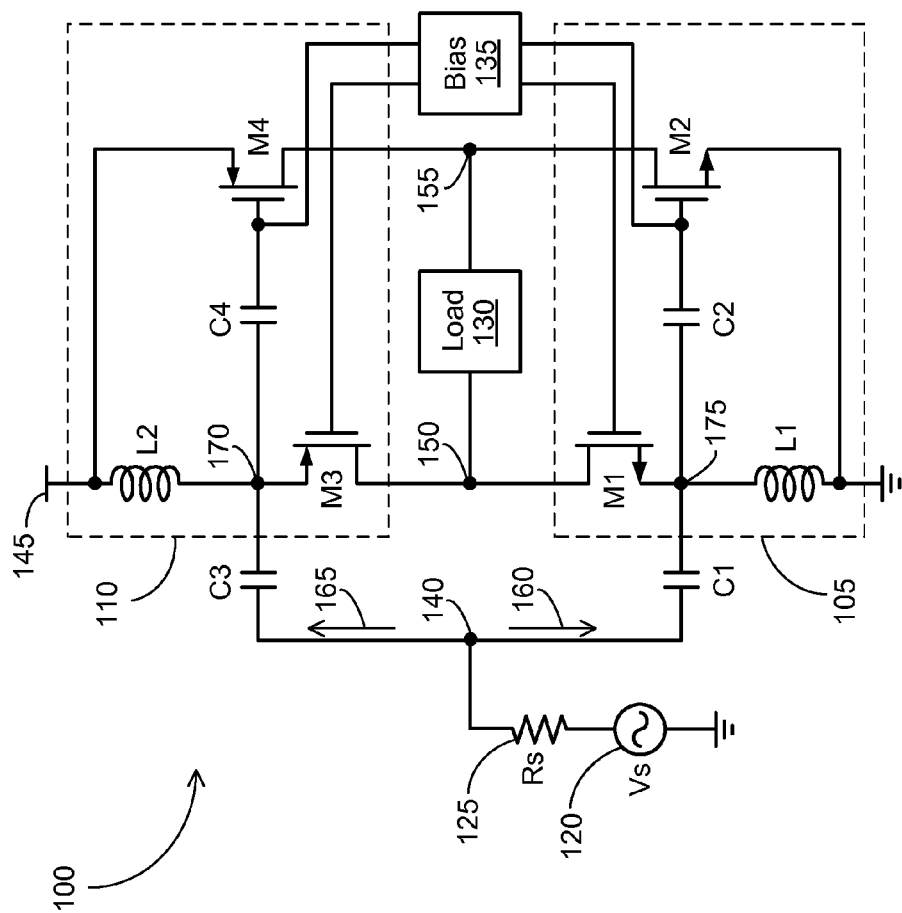
FIG. 3 illustrates a push-pull complementary single-to-differential wide-band LNA in accordance with some embodiments.

FIG. 3 is a partial block and partial schematic diagram of a novel push-pull complementary single-ended-to-differential wide-band LNA 100 in accordance with some embodiments. As shown in FIG. 3, LNA 100 is coupled to a signal source (e.g., the received wide-band signal, such as a television signal), which is modeled as a voltage source (Vs) 120 that applies a signal to a resistance (Rs) 125. Resistance 125 may be, for example, a 75 Ohm resistor. The in-series combination of the voltage source 120 and the resistance 125 is coupled to an input node 140 of LNA 100.

The embodiment of LNA 100 in FIG. 3 uses a complementary push-pull structure. A first part of the single-ended input signal, labeled as 160, flows from the input node 140 through DC blocking capacitor C1 into NMOS LNA unit 105. NMOS LNA unit 105 includes a first node 175, NMOS transistors M1 and M2, DC blocking capacitor C2, and current feeding inductor L1. A second part of the single-ended input signal, labeled as 165, flows from the input node 140 through DC blocking capacitor C3 into PMOS LNA unit 110. PMOS LNA unit 110 includes a second node 170, PMOS transistors M3 and M4, DC blocking capacitor C4, and current feeding inductor L2.

Transistor M1 includes a source coupled to a first terminal of capacitor C1, a first terminal of capacitor C2, and a first terminal of inductor L1. A second terminal of inductor L1 is coupled to ground. Transistor M1 further includes a gate coupled to bias circuitry 135 and a drain coupled both to load 130 and to a drain of transistor M3. Transistor M2 includes a gate coupled to a second terminal of capacitor C2 and to bias circuitry 135. Transistor M2 further includes a source coupled to ground, and a drain that is coupled both to load 130 and to a drain of transistor M4.

Transistor M3 includes a source coupled to a first terminal of capacitor C3, a first terminal of inductor L2, and a first terminal of capacitor C4. A second terminal of inductor L2 is coupled to supply voltage 145. Transistor M3 further includes a gate coupled to bias circuitry 135, and a drain coupled both to load 130 and to the drain of transistor M1. Transistor M4 includes a gate coupled to a second terminal of capacitor C4 and to bias circuitry 135. Transistor M4 further includes a source coupled to supply voltage 145.

The bias circuitry 135 applies bias currents so that the transistors M1, M2, M3, and M4 remain in the active region of operation. The bias circuitry 135 is conventional and well known in the art, and a person having ordinary skill in the art will understand how to make and use the bias circuitry 135. In addition, many prior art references disclose bias circuits. For example, bias circuits are disclosed in U.S. Pat. No. 7,184,799 to Jin et al. (filed Jan. 26, 2004, issued Feb. 27, 2007) and U.S. Pat. No. 7,098,739 to Chow et al. (filed Oct. 28, 2004, issued Aug. 29, 2006), both of which are hereby incorporated by reference for all purposes. Bias circuits are also disclosed in U.S. Patent Publication No. US 2009/0027128A1 by Ishiguro (filed Jul. 25, 2008), which is hereby incorporated by reference for all purposes, and in the above-discussed paper by W. Zhuo et al. entitled "Using Capacitive Cross-Coupling Technique in RF Low Noise Amplifiers and Down-Conversion Mixer Design," which is also hereby incorporated by reference for all purposes.

The positively amplified output signals from NMOS LNA unit 105 and PMOS LNA 110 add together at the positive output node 150, which couples together the drains of transistors M1 and M3. The negatively amplified counterparts add together at the negative output node 155, which couples together the drains of transistors M2 and M4.

In some embodiments, the capacitors C2 and C4, the transistors M1, M2, M3, and M4, the load 130, and the bias circuitry 135 of FIG. 3 are all integrated in a single chip, whereas the inductors L1 and L2 and the capacitors C1 and C3 are on board, but not on-chip. In some embodiments, the inductors L1 and L2 and the capacitors C1 and C3 are not included on-chip because they are too large to fit on-chip.

Figure 2:
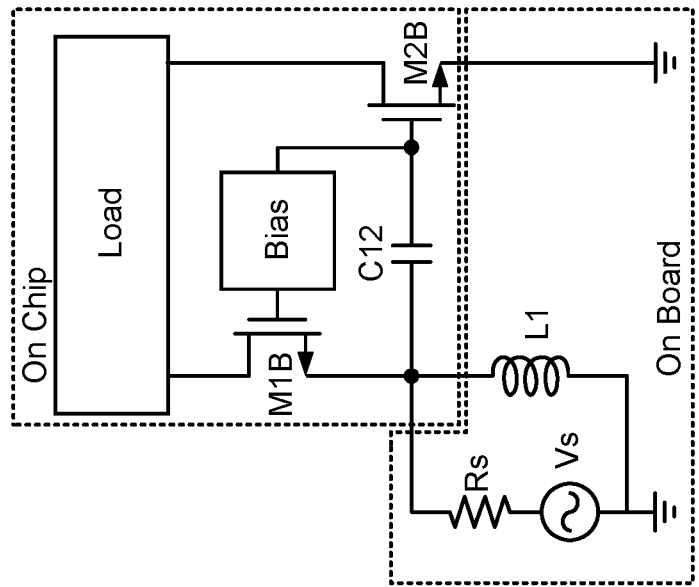
FIG. 2 illustrates another conventional wide-band LNA.

NMOS LNA unit 105 and PMOS LNA unit 110 provide noise and nonlinear product canceling abilities commensurate with those of the CG-CS LNA discussed in the context of FIG. 2. Specifically, the exemplary LNA 100 of FIG. 3 can cancel most of the noise and nonlinear products of the common-gate-connected transistors M1 and M3. As a consequence, LNA 100 has a low noise factor and high linearity.

As compared to the CG-CS LNA discussed in the context of FIG. 2, the complementary push-pull structure of LNA 100 further improves linearity performance by reducing the second-order and third-order nonlinear effects of the common-source-connected transistors M2 and M4. Assuming that the input voltage is denoted as $V_{in}$, the drain currents of transistors M2 and M4 are, respectively.

$$I_2 = K_N \cdot \left(\frac{W}{L}\right)_N \cdot (|V_{GST,N}| + V_{in})^2$$

and $$I_4 = K_P \cdot \left(\frac{W}{L}\right)_P \cdot (|V_{GST,P}| + V_{in})^2.$$

In the equations above, $K_N$ and $K_P$ are the process constants of NMOS and PMOS transistors respectively. $(W/L)_N$ is the ratio of the width to the length of transistor M2, and $(W/L)_P$ is the ratio of the width to the length of transistor M4. $V_{GST,N}$ is the over-driving voltage of NMOS transistors M1 and M2, and $V_{GST,P}$ is the over-driving voltage of PMOS transistors M3 and M4. In some embodiments, the voltages $V_{GST,N}$ and $V_{GST,P}$ are about 0.2 Volts, which means the minimum of the supply voltage 145 can also be very low in these embodiments.

Transistors M2 and M4 have the same static biasing current because of current reuse. Therefore, the output signal current at the negative output node 155 is $$I_{out} = I_4 - I_2 = 2 \cdot (K_N \cdot |V_{GST,N}| K_P \cdot |V_{GST,P}|) \cdot V_{in}.$$

As shown by the above equation for the output signal current, the second-order harmonic of the output signal is cancelled. Because the nonlinear products of the common-gate-connected transistors are cancelled, LNA 100 has high linearity. The linearity of LNA 100 is higher than the linearity of the CG-CS LNA shown in FIG. 2.

Figure 1:
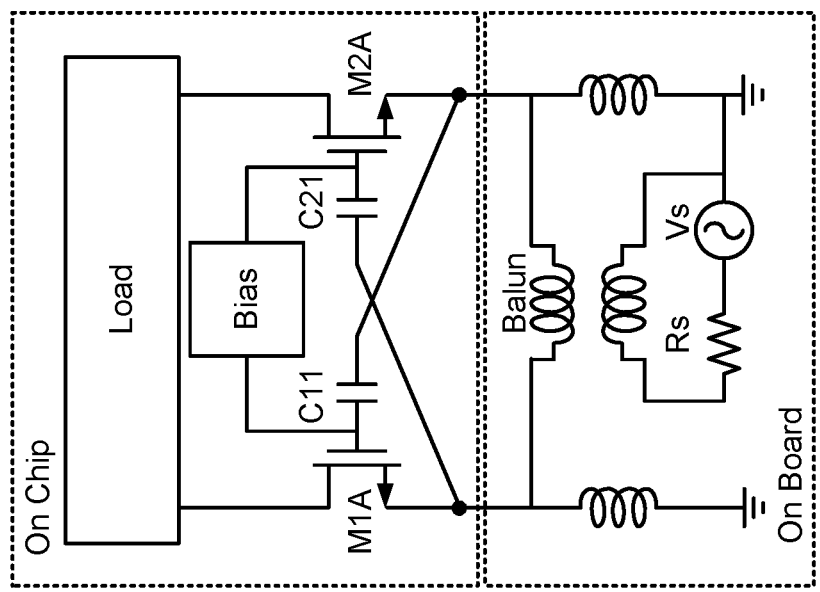
FIG. 1 illustrates a conventional wide-band LNA.

The input impedance $Z_{in}$ of LNA 100 is given by $$Z_{in} = \frac{1}{g_{m1} + g_{m3}}$$

where $g_{m1}$ and $g_{m3}$ are, respectively, the transconductances of transistors M1 and M3. Benefiting from current reuse, the minimum static biasing current needed for input impedance matching is only a quarter of the current used by the prior-art LNA shown in FIG. 1 and half of the current used by the CG-CS LNA shown in FIG. 2.

Another advantage of LNA 100 is that the static biasing current does not flow through the load, and there is no dropout. Thus, the minimum supply voltage 145 for transistors M1, M2, M3, and M4 working under the saturation state is $$V_{source,min} = V_{GST,N} + V_{GST,P}.$$

Figure 4:
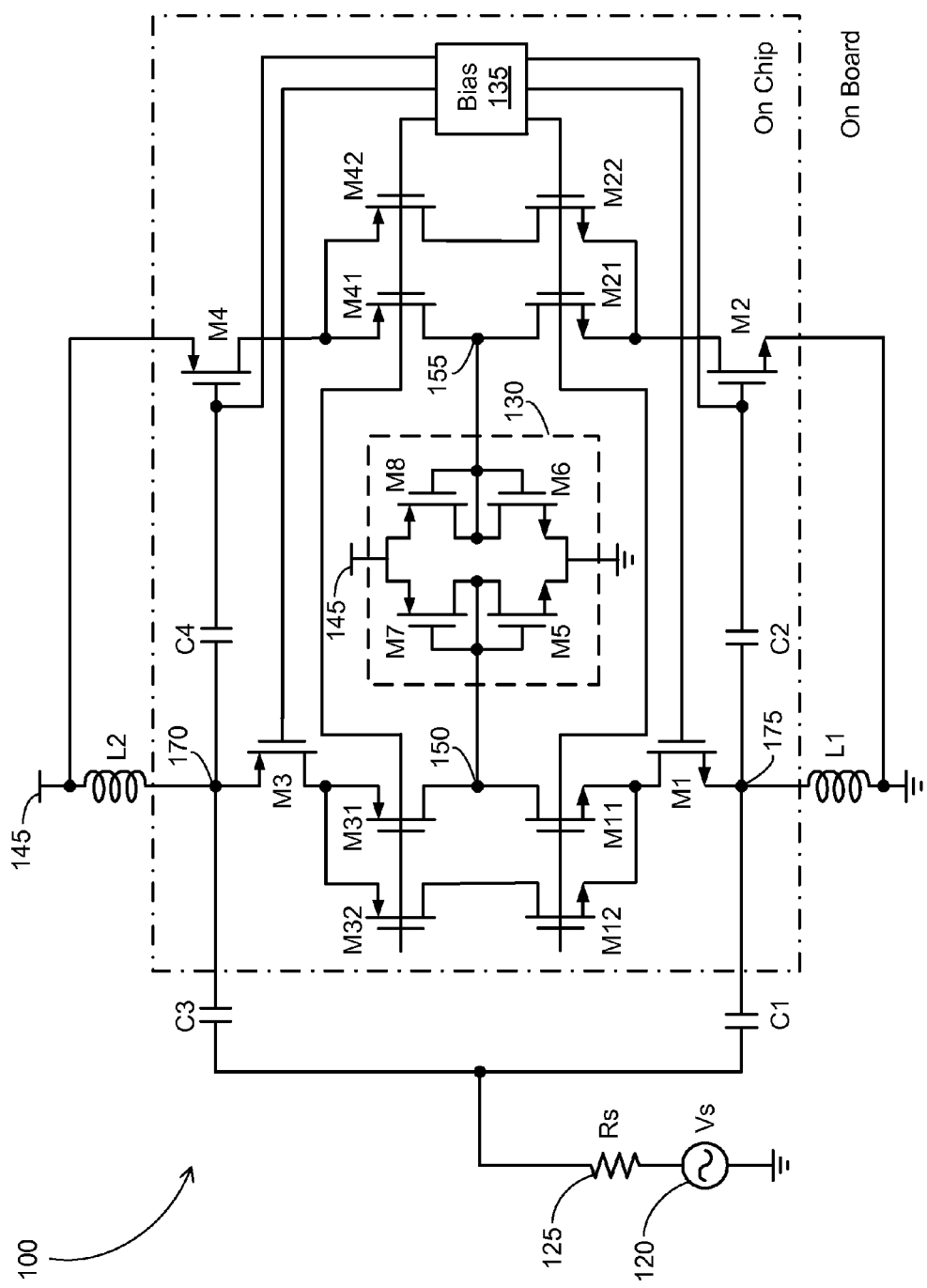
FIG. 4 illustrates a push-pull complementary single-ended-to-differential wide-band LNA with load and gain control circuitry in accordance with some embodiments.

FIG. 4 illustrates an exemplary load 130 of LNA 100 in accordance with some embodiments. The positions of and couplings between the components previously illustrated in FIG. 3 (i.e., capacitors C1, C2, C3, and C4, inductors L1 and L2, and transistors M1, M2, M3, and M4) are the same in FIG. 4, and the description of those positions and couplings is not repeated here. The load 130 includes MOS transistors M5, M6, M7, and M8. The gates of NMOS transistor M5 and PMOS transistor M7 are coupled together and to the positive output node 150. Likewise, the drains of NMOS transistor M5 and PMOS transistor M7 are coupled together and to the positive output node 150. Similarly, the gates of NMOS transistor M6 and PMOS transistor M8 are coupled together and to the negative output node 155, and the drains of NMOS transistor M6 and PMOS transistor M8 are coupled together and to the negative output node 155. The sources of PMOS transistors M7 and M8 are coupled to supply voltage 145, and the sources of NMOS transistors M5 and M6 are coupled to ground.

By carefully choosing the sizes of the transistors M5, M6, M7, and M8, the output DC voltage can be stabilized at about half of the supply voltage 145. By tuning the size ratios between transistors M5 and M6 and between transistors M7 and M8, the differential outputs at positive output node 150 and negative output node 155 can be balanced.

As illustrated FIG. 4, to enable gain control, in some embodiments the LNA 100 may include gain control circuitry comprising additional PMOS transistors M31, M32, M41, and M42, and additional NMOS transistors M11, M12, M21, and M22. In the exemplary embodiment of FIG. 4, the sources of PMOS transistors M31 and M32 are coupled to the drain of PMOS transistor M3, and the sources of NMOS transistors M11 and M12 are coupled to the drain of NMOS transistor M1. Similarly, the sources of PMOS transistors M41 and M42 are coupled to the drain of PMOS transistor M4, and the sources of NMOS transistors M21 and M22 are coupled to the drain of NMOS transistor M2. The drains of PMOS transistor M31 and NMOS transistor M11 are coupled to load 130 at the positive output node 150, and the drains of PMOS transistor M41 and NMOS transistor M21 are coupled to load 130 at the negative output node 155. The drains of PMOS transistor M32 and NMOS transistor M12 are coupled together, as are the drains of PMOS transistor M42 and NMOS transistor M22. The gates of PMOS transistors M31, M32, M41, M42, and NMOS transistors M11, M12, M21, and M22 are all coupled to the bias circuitry 135. As explained above, the bias circuitry 135 is conventional, and a person having ordinary skill in the art will understand how to make and use the bias circuitry 135.

The embodiment of LNA 100 illustrated in FIG. 4 has the ability to modify the gain provided by LNA 100 while maintaining a matched input impedance. For example, if each of transistors M11 and M12 is a bank of MOS transistors in the switching state, modifying the number of switched-on transistors in M11 (or in M12) will change the signal current flowing to the load 130, thus changing the voltage gain. Current steering technology may be used to keep the static biasing current flowing into transistor M1 invariable, thus maintaining the input impedance. Current steering technology is known in the art, and a person having ordinary skill in the art will know how to use steering current technology to achieve the stated result. For example, current steering approaches are disclosed in U.S. Pat. No. 7,164,318 to Costa et al. (filed Aug. 26, 2004, issued Jan. 16, 2007) and U.S. Pat. No. 8,698,560 to Li et al. (filed May 9, 2012, issued Apr. 15, 2014), both of which are hereby incorporated by reference for all purposes.

It is to be appreciated that although FIGS. 3 and 4 illustrate exemplary embodiments of LNA 100 that use NMOS and PMOS transistors, some or all of the MOS transistors could be replaced by bipolar junction transistors (BJTs) instead. It is also to be appreciated that although the exemplary embodiments of LNA 100 shown in FIGS. 3 and 4 include various capacitors, inductors, and transistors, some or all of these components can be removed or replaced by other components or combinations of components having similar or equivalent properties.

Furthermore, although this disclosure focuses on television signals, the disclosure is applicable to receivers of other wide-band signals that use a LNA, such as, for example, satellite radio, FM radio, cognitive radio, software-defined radio, and the like.

Although the invention has been described with respect to certain embodiments, various variations and modifications may be effected without departing from the spirit and scope of the novel concepts of the disclosure. The invention is not to be limited by the disclosed embodiments, as changes and modifications can be made that are within the full and intended scope of the invention as defined by the following claims.

What is claimed is:

1. An amplifier, comprising:
an input node coupled to a source of a first PMOS transistor and to a source of a first NMOS transistor;
a positive output node coupled to a drain of the first PMOS transistor and to a drain of the first NMOS transistor;
a negative output node coupled to a drain of a second PMOS transistor and to a drain of a second NMOS transistor; and
bias circuitry coupled to a gate of the first PMOS transistor, and to a gate of the second PMOS transistor, and to a gate of the first NMOS transistor, and to a gate of the second NMOS transistor,
wherein:
the source of the first PMOS transistor is further coupled to the gate of the second PMOS transistor,
the source of the first NMOS transistor is further coupled to the gate of the second NMOS transistor,
a source of the second PMOS transistor is coupled to a first supply voltage, and
a source of the second NMOS transistor is coupled to a second supply voltage.

2. The amplifier of claim 1, wherein the second supply voltage is ground.

3. The amplifier of claim 1, further comprising:
a first capacitor disposed between the input node and the source of the first PMOS transistor; and
a second capacitor disposed between the input node and the source of the first NMOS transistor.

4. The amplifier of claim 1, further comprising:
a first capacitor disposed between the source of the first PMOS transistor and the gate of the second PMOS transistor; and
a second capacitor disposed between the source of the first NMOS transistor and the gate of the second NMOS transistor.

5. The amplifier of claim 1, further comprising:
a first inductor disposed between the first supply voltage and a first node coupling the source of the first PMOS transistor to the gate of the second PMOS transistor; and
a second inductor disposed between the second supply voltage and a second node coupling the source of the first NMOS transistor to the gate of the second NMOS transistor.

6. The amplifier of claim 1, further comprising:
a first capacitor disposed between the input node and the source of the first PMOS transistor;
a second capacitor disposed between the input node and the source of the first NMOS transistor;
a third capacitor disposed between the source of the first PMOS transistor and the gate of the second PMOS transistor;
a fourth capacitor disposed between the source of the first NMOS transistor and the gate of the second NMOS transistor;
a first inductor disposed between the first supply voltage and a first node coupling the source of the first PMOS transistor to the gate of the second PMOS transistor; and
a second inductor disposed between the second supply voltage and a second node coupling the source of the first NMOS transistor to the gate of the second NMOS transistor.

7. The amplifier of claim 1, further comprising a load circuit disposed between the positive output node and the negative output node, the load circuit comprising a third PMOS transistor, a fourth PMOS transistor, a third NMOS transistor, and a fourth NMOS transistor, wherein:
a source of the third PMOS transistor and a source of the fourth PMOS transistor are coupled to the first supply voltage,
a source of the third NMOS transistor and a source of the fourth NMOS transistor are coupled to the second supply voltage,
a gate and a drain of the third PMOS transistor and a gate and a drain of the third NMOS transistor are coupled to the positive output node, and
a gate and a drain of the fourth PMOS transistor and a gate and a drain of the fourth NMOS transistor are coupled to the negative output node.

8. The amplifier of claim 1, further comprising gain control circuitry comprising a third PMOS transistor, a fourth PMOS transistor, a fifth PMOS transistor, a sixth PMOS transistor, a third NMOS transistor, a fourth NMOS transistor, a fifth NMOS transistor, and a sixth NMOS transistor, wherein:
a source of the third PMOS transistor and a source of the fourth PMOS transistor are coupled to the drain of the first PMOS transistor,
a source of the fifth PMOS transistor and a source of the sixth PMOS transistor are coupled to the drain of the second PMOS transistor,
a source of the third NMOS transistor and a source of the fourth NMOS transistor are coupled to the drain of the first NMOS transistor, a source of the fifth NMOS transistor and a source of the sixth NMOS transistor are coupled to the drain of the second NMOS transistor, a drain of the fourth PMOS transistor and a drain of the fourth NMOS transistor are coupled to the positive output node, a drain of the fifth PMOS transistor and a drain of the fifth NMOS transistor are coupled to the negative output node, a gate of the third PMOS transistor, a gate of the fourth PMOS transistor, a gate of the fifth PMOS transistor, and a gate of the sixth PMOS transistor are coupled to the bias circuitry, and a gate of the third NMOS transistor, a gate of the fourth NMOS transistor, a gate of the fifth NMOS transistor, and a gate of the sixth NMOS transistor are coupled to the bias circuitry.

9. The amplifier of claim 1, further comprising:

gain control circuitry comprising a third PMOS transistor, a fourth PMOS transistor, a fifth PMOS transistor, a sixth PMOS transistor, a third NMOS transistor, a fourth NMOS transistor, a fifth NMOS transistor, and a sixth NMOS transistor, wherein:

a source of the third PMOS transistor and a source of the fourth PMOS transistor are coupled to the drain of the first PMOS transistor, a source of the fifth PMOS transistor and a source of the sixth PMOS transistor are coupled to the drain of the second PMOS transistor, a source of the third NMOS transistor and a source of the fourth NMOS transistor are coupled to the drain of the first NMOS transistor, a source of the fifth NMOS transistor and a source of the sixth NMOS transistor are coupled to the drain of the second NMOS transistor, a drain of the fourth PMOS transistor and a drain of the fourth NMOS transistor are coupled to the positive output node, a drain of the fifth PMOS transistor and a drain of the fifth NMOS transistor are coupled to the negative output node, a gate of the third PMOS transistor, a gate of the fourth PMOS transistor, a gate of the fifth PMOS transistor, and a gate of the sixth PMOS transistor are coupled to the bias circuitry, and a gate of the third NMOS transistor, a gate of the fourth NMOS transistor, a gate of the fifth NMOS transistor, and a gate of the sixth NMOS transistor are coupled to the bias circuitry; and a load circuit disposed between the positive output node and the negative output node, the load circuit comprising a seventh PMOS transistor, an eighth PMOS transistor, a seventh NMOS transistor, and an eighth NMOS transistor, wherein:

a source of the seventh PMOS transistor and a source of the eighth PMOS transistor are coupled to the first supply voltage, a source of the seventh NMOS transistor and a source of the eighth NMOS transistor are coupled to the second supply voltage, a gate and a drain of the seventh PMOS transistor and a gate and a drain of the seventh NMOS transistor are coupled to the positive output node, and a gate and a drain of the eighth PMOS transistor and a gate and a drain of the eighth NMOS transistor are coupled to the negative output node.

10. An amplifier, comprising:

an integrated circuit comprising:

a positive output node coupled to a drain of a first PMOS transistor and to a drain of a first NMOS transistor, a negative output node coupled to a drain of a second PMOS transistor and to a drain of a second NMOS transistor, a first node coupling a source of the first NMOS transistor to a gate of the second NMOS transistor, a second node coupling a source of the first PMOS transistor to a gate of the second PMOS transistor, bias circuitry coupled to the first node, and to the second node, and to a gate of the first PMOS transistor, and to a gate of the first NMOS transistor, a first capacitor disposed between the first node and the gate of the second NMOS transistor, and a second capacitor disposed between the second node and the gate of the second PMOS transistor; and an input node coupled to the first node and to the second node.

11. An amplifier, comprising:

an integrated circuit comprising:

a positive output node coupled to a drain of a first PMOS transistor and to a drain of a first NMOS transistor, a negative output node coupled to a drain of a second PMOS transistor and to a drain of a second NMOS transistor, a first node coupling a source of the first NMOS transistor to a gate of the second NMOS transistor, a second node coupling a source of the first PMOS transistor to a gate of the second PMOS transistor, and bias circuitry coupled to the first node, and to the second node, and to a gate of the first PMOS transistor, and to a gate of the first NMOS transistor;

an input node coupled to the first node and to the second node;

a first inductor disposed between a first supply voltage and the first node; and a second inductor disposed between a second supply voltage and the second node.

12. The amplifier of claim 11, further comprising:

a first capacitor disposed between the input node and the first node; and a second capacitor disposed between the input node and the second node.

13. The amplifier of claim 11, wherein the first supply voltage is ground.

14. An amplifier, comprising:

an integrated circuit comprising:

a positive output node coupled to a drain of a first PMOS transistor and to a drain of a first NMOS transistor, a negative output node coupled to a drain of a second PMOS transistor and to a drain of a second NMOS transistor, a first node coupling a source of the first NMOS transistor to a gate of the second NMOS transistor, a second node coupling a source of the first PMOS transistor to a gate of the second PMOS transistor, bias circuitry coupled to the first node, and to the second node, and to a gate of the first PMOS transistor, and to a gate of the first NMOS transistor, and a load circuit disposed between the positive output node and the negative output node, the load circuit comprising a third PMOS transistor, a fourth PMOS transistor, a third NMOS transistor, and a fourth NMOS transistor, wherein:
  a source of the third PMOS transistor and a source of the fourth PMOS transistor are coupled to the second supply voltage,
  a source of the third NMOS transistor and a source of the fourth NMOS transistor are coupled to the first supply voltage,
  a gate and a drain of the third PMOS transistor and a gate and a drain of the third NMOS transistor are coupled to the positive output node, and
  a gate and a drain of the fourth PMOS transistor and a gate and a drain of the fourth NMOS transistor are coupled to the negative output node; and
an input node coupled to the first node and to the second node.

15. An amplifier, comprising:
an integrated circuit comprising:
  a positive output node coupled to a drain of a first PMOS transistor and to a drain of a first NMOS transistor,
  a negative output node coupled to a drain of a second PMOS transistor and to a drain of a second NMOS transistor,
  a first node coupling a source of the first NMOS transistor to a gate of the second NMOS transistor,
  a second node coupling a source of the first PMOS transistor to a gate of the second PMOS transistor,
  bias circuitry coupled to the first node, and to the second node, and to a gate of the first PMOS transistor, and to a gate of the first NMOS transistor, and
  gain control circuitry comprising a third PMOS transistor, a fourth PMOS transistor, a fifth PMOS transistor, a sixth PMOS transistor, a third NMOS transistor, a fourth NMOS transistor, a fifth NMOS transistor, and a sixth NMOS transistor, wherein:
    a source of the third PMOS transistor and a source of the fourth PMOS transistor are coupled to the drain of the first PMOS transistor,
    a source of the fifth PMOS transistor and a source of the sixth PMOS transistor are coupled to the drain of the second PMOS transistor,
    a source of the third NMOS transistor and a source of the fourth NMOS transistor are coupled to the drain of the first NMOS transistor,
    a source of the fifth NMOS transistor and a source of the sixth NMOS transistor are coupled to the drain of the second NMOS transistor,
    a drain of the fourth PMOS transistor is coupled to a drain of the fourth NMOS transistor,
    a drain of the fifth PMOS transistor is coupled to a drain of the fifth NMOS transistor,
    a gate of the third PMOS transistor, a gate of the fourth PMOS transistor, a gate of the fifth PMOS transistor, and a gate of the sixth PMOS transistor are coupled to the bias circuitry, and
    a gate of the third NMOS transistor, a gate of the fourth NMOS transistor, a gate of the fifth NMOS transistor, and a gate of the sixth NMOS transistor are coupled to the bias circuitry; and
an input node coupled to the first node and to the second node.

16. An integrated circuit for use in a low-noise amplifier (LNA), the integrated circuit comprising:
  a first PMOS transistor;
  a second PMOS transistor;
  a first NMOS transistor;
  a second NMOS transistor;
  a bias circuit; and
  a load circuit comprising a third PMOS transistor, a fourth PMOS transistor, a third NMOS transistor, and a fourth NMOS transistor,
  wherein:
    a drain of the first PMOS transistor and a drain of the first NMOS transistor are coupled to a first output node,
    a drain of the second PMOS transistor and a drain of the second NMOS transistor are coupled to a second output node,
    a source of the first PMOS transistor is coupled to a gate of the second PMOS transistor,
    a source of the first NMOS transistor is coupled to a gate of the second NMOS transistor,
    the source of the first PMOS transistor, the gate of the first PMOS transistor, the gate of the second PMOS transistor, the source of the first NMOS transistor, the gate of the first NMOS transistor, and the gate of the second NMOS transistor are coupled to the bias circuit,
    the load circuit is disposed between the first output node and the second output node,
    a source of the third PMOS transistor and a source of the fourth PMOS transistor are coupled to a first supply voltage,
    a source of the third NMOS transistor and a source of the fourth NMOS transistor are coupled to a second supply voltage,
    a gate and a drain of the third PMOS transistor and a gate and a drain of the third NMOS transistor are coupled to the first output node, and
    a gate and a drain of the fourth PMOS transistor and a gate and a drain of the fourth NMOS transistor are coupled to the second output node.

17. The integrated circuit of claim 16, wherein the first output node is a positive output node, and the second output node is a negative output node.

18. An integrated circuit for use in a low-noise amplifier (LNA), the integrated circuit comprising:
  a first PMOS transistor;
  a second PMOS transistor;
  a first NMOS transistor;
  a second NMOS transistor;
  a bias circuit; and
  gain control circuitry comprising a third PMOS transistor, a fourth PMOS transistor, a fifth PMOS transistor, a sixth PMOS transistor, a third NMOS transistor, a fourth NMOS transistor, a fifth NMOS transistor, and a sixth NMOS transistor,
  wherein:
    a drain of the first PMOS transistor and a drain of the first NMOS transistor are coupled to a first output node,
    a drain of the second PMOS transistor and a drain of the second NMOS transistor are coupled to a second output node,
    a source of the first PMOS transistor is coupled to a gate of the second PMOS transistor,
    a source of the first NMOS transistor is coupled to a gate of the second NMOS transistor,
    the source of the first PMOS transistor, the gate of the first PMOS transistor, the gate of the second PMOS transistor, the source of the first NMOS transistor, the gate of the first NMOS transistor, and the gate of the second NMOS transistor are coupled to the bias circuit, a source of the third PMOS transistor and a source of the fourth PMOS transistor are coupled to the drain of the first PMOS transistor, a source of the fifth PMOS transistor and a source of the sixth PMOS transistor are coupled to the drain of the second PMOS transistor, a source of the third NMOS transistor and a source of the fourth NMOS transistor are coupled to the drain of the first NMOS transistor, a source of the fifth NMOS transistor and a source of the sixth NMOS transistor are coupled to the drain of the second NMOS transistor, a drain of the fourth PMOS transistor is coupled to a drain of the fourth NMOS transistor, a drain of the fifth PMOS transistor is coupled to a drain of the fifth NMOS transistor, a gate of the third PMOS transistor, a gate of the fourth PMOS transistor, a gate of the fifth PMOS transistor, and a gate of the sixth PMOS transistor are coupled to the bias circuit, and a gate of the third NMOS transistor, a gate of the fourth NMOS transistor, a gate of the fifth NMOS transistor, and a gate of the sixth NMOS transistor are coupled to the bias circuit.

19. The integrated circuit of claim 18, wherein the first output node is a positive output node, and the second output node is a negative output node.

20. The amplifier of claim 10, further comprising:

a third capacitor disposed between the input node and the first node; and a fourth capacitor disposed between the input node and the second node.

* * * * *